United States Patent
Nakai et al.

(10) Patent No.: US 8,334,525 B2
(45) Date of Patent: Dec. 18, 2012

(54) NONVOLATILE SEMICONDUCTOR MEMORY DEVICE INCLUDING A VARIABLE RESISTANCE LAYER INCLUDING CARBON

(75) Inventors: Tsukasa Nakai, Hino (JP); Hiroyuki Fukumizu, Yokohama (JP); Yasuhiro Nojiri, Yokohama (JP); Motoya Kishida, Yokohama (JP); Kazuyuki Yahiro, Kawasaki (JP); Yasuhiro Satoh, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 282 days.

(21) Appl. No.: 12/825,975

(22) Filed: Jun. 29, 2010

(65) Prior Publication Data

US 2010/0327253 A1 Dec. 30, 2010

(30) Foreign Application Priority Data

Jun. 30, 2009 (JP) ................................ 2009-155863

(51) Int. Cl.
*H01L 29/02* (2006.01)
(52) U.S. Cl. .. 257/2; 257/3; 257/4; 257/5; 257/E29.002; 438/102; 438/103; 438/104; 365/163
(58) Field of Classification Search ................... 257/2–5, 257/E29.002; 438/102–104; 365/163
See application file for complete search history.

(56) References Cited

U.S. PATENT DOCUMENTS

2010/0032639 A1\* 2/2010 Xu ..................................... 257/2
2010/0108981 A1\* 5/2010 Jayasekara ........................ 257/5

FOREIGN PATENT DOCUMENTS

JP 2008-166591 7/2008

OTHER PUBLICATIONS

U.S. Appl. No. 12/882,822, filed Sep. 15, 2010, Nakai, et al.

\* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, a variable resistance layer includes a mixture of a first compound and a second compound. The first compound includes carbon (C) as well as at least one element selected from a group of elements G1. The group of elements G1 consists of hydrogen (H), boron (B), nitrogen (N), silicon (Si), and titanium (Ti). The second compound includes at least one compound selected from a group of compounds G2. The group of compounds G2 consists of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC). Concentration of the first compound in the variable resistance layer is not less than 30 volume percent, and not more than 70 volume percent.

17 Claims, 3 Drawing Sheets

NONVOLATILE SEMICONDUCTOR MEMORY DEVICE INCLUDING A VARIABLE RESISTANCE LAYER INCLUDING CARBON

CROSS-REFERENCE TO RELATED APPLICATIONS

This application is based upon and claims the benefit of priority from the prior Japanese Patent Application No. 2009-155863, filed on Jun. 30, 2009, the entire contents of which are incorporated herein by reference.

BACKGROUND

1. Field

The Embodiment herein relates to a nonvolatile semiconductor memory device including electrically rewritable memory cells.

2. Description of the Related Art

In recent years, demand for small, large capacity information read/write devices (memory devices) has grown rapidly. Two such devices, NAND flash memory and small HDD (hard disk drive), have shown rapid advances in recording density and thereby come to form a large market. Such circumstances have led to the proposal of a number of ideas for new memory that aim to exceed a limit of recording density.

In this kind of memory, a voltage pulse can be applied to a resistance changing element to repeatedly change the resistance thereof between a low-resistance state and a high-resistance state, thereby storing data by correspondence of these two states to binary data "0" and "1". Moreover, it is expected multilevel data storage is accomplished to further improve recording density.

However, there arises a problem that, when levels of multilevel storage and recording density are raised, there is an increased probability of incorrect information being written during write or erase of information (there is an increased probability of incorrect switching). Lowering the probability of incorrect switching requires a resistance changing material with a high resistance ratio between the low-resistance state and the high-resistance state.

Under such requirement, various materials have been developed as the material for the resistance changing element, among which a resistance changing material composed mainly of carbon (C) is a leading candidate. For example, there is additionally proposed a nonvolatile memory utilizing a resistance changing material in which titanium (Ti) is embedded within carbon nanotubes to raise the resistance ratio between the low-resistance state and the high-resistance state.

However, there is a problem in a conventional resistance changing material mainly composed of carbon that the resistance value in the low-resistance state becomes too low. If the resistance value of the low-resistance state becomes too low, the problem arises that the cell current increases whereby power consumption increases. As seen above, there is yet to be proposed a resistance changing material that combines suppression of power consumption and reduction in risk of incorrect switching.

DETAILED DESCRIPTION

Figure 1:
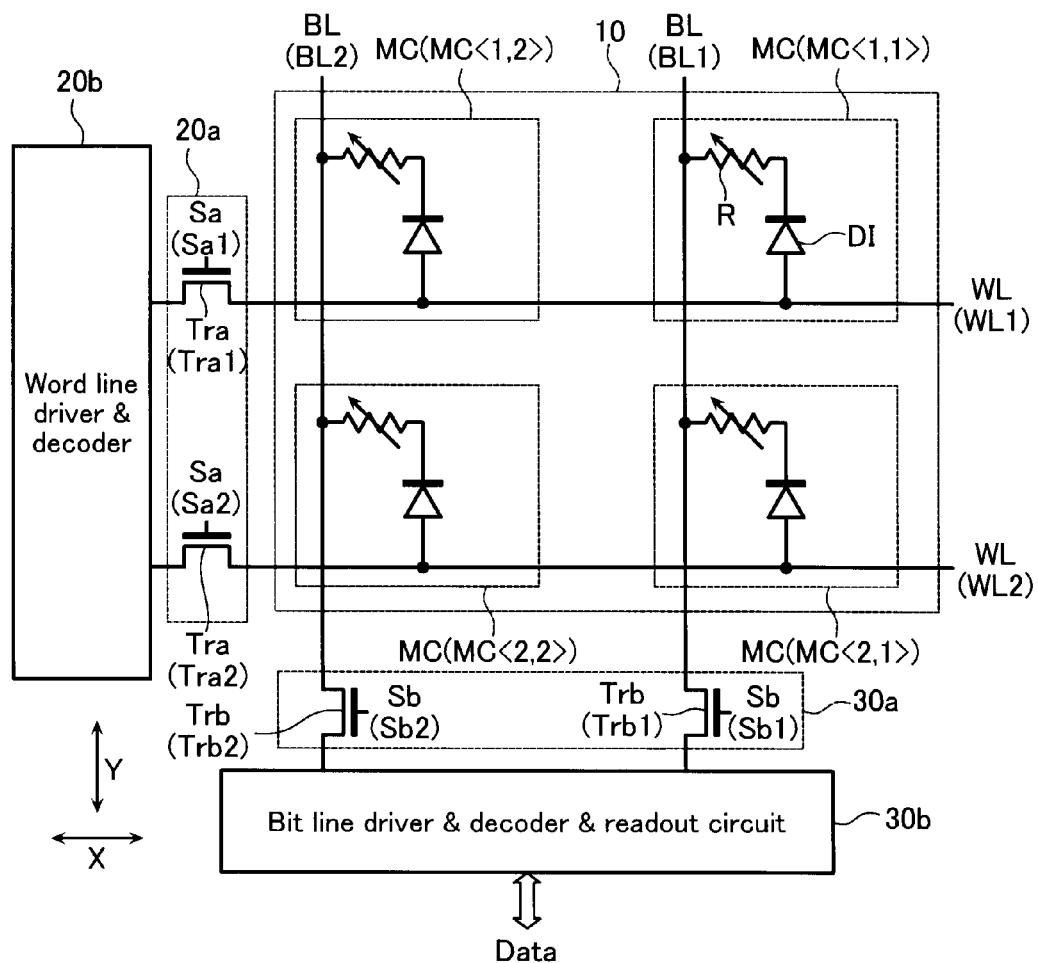
FIG. 1 is a circuit diagram of a nonvolatile semiconductor memory device in accordance with an embodiment.

According to one embodiment, a nonvolatile semiconductor memory device comprises electrically rewritable memory cells. Each of the memory cells comprises a variable resistance layer with electrical resistivity changeable by at least one of an applied voltage and a conducting current. The variable resistance layer includes a mixture of a first compound and a second compound. The first compound includes carbon (C) as well as at least one element selected from a group of elements G1. The group of elements G1 consists of hydrogen (H), boron (B), nitrogen (N), silicon (Si), and titanium (Ti). The second compound includes at least one compound selected from a group of compounds G2. The group of compounds G2 consists of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC). Concentration of the first compound in the variable resistance layer is not less than 30 volume percent, and not more than 70 volume percent.

According to one embodiment, a nonvolatile semiconductor memory device comprises electrically rewritable memory cells. Each of the memory cells comprises a variable resistance layer with electrical resistivity changeable by at least one of an applied voltage and a conducting current. The variable resistance layer includes a mixture of a first compound and a second compound. The first compound includes carbon (C) as well as at least one element selected from a group of elements G1. The group of elements G1 consist of boron (B), nitrogen (N), silicon (Si), and titanium (Ti). The second compound includes at least one compound selected from a group of compounds G2. The group of compounds G2 consists of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC). Concentration of the group of elements G1 in the first compound is 0.01-20 atomic percent.

According to one embodiment, a nonvolatile semiconductor memory device comprises electrically rewritable memory cells. Each of the memory cells comprises a variable resistance layer with electrical resistivity changeable by at least one of an applied voltage and a conducting current. The variable resistance layer includes a mixture of a first compound and a second compound. The first compound includes carbon (C) and hydrogen (H). The second compound includes at least one compound selected from a group of compounds G2. The group of compounds G2 consists of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC). Concentration of the hydrogen (H) in the first compound is 10-65 atomic percent.

An embodiment of a nonvolatile semiconductor memory device in accordance with the present invention is described below with reference to the drawings.

Embodiment

[Circuit Configuration of Nonvolatile Semiconductor Memory Device in Accordance with Embodiment]

First, a circuit configuration of a nonvolatile semiconductor memory device in accordance with an embodiment of the present invention is described with reference to FIG. 1. FIG. 1 is a circuit diagram of the nonvolatile semiconductor memory device in accordance with the embodiment.

As shown in FIG. 1, the nonvolatile semiconductor memory device in accordance with the embodiment includes a memory cell array 10, a word line selection circuit 20a, a word line drive circuit 20b, a bit line selection circuit 30a, and a bit line drive circuit 30b.

As shown in FIG. 1, the memory cell array 10 includes word lines WL (WL1, WL2) and bit lines BL (BL1, BL2) intersecting each other, and memory cells MC (MC<1,1>-MC<2,2>) positioned at respective intersections between the word lines WL and the bit lines BL. The word lines WL are arranged in a Y direction with a certain pitch, and formed extending in an X direction. The bit lines BL are arranged in the X direction with a certain pitch, and formed extending in the Y direction. That is, the memory cells MC are disposed in a matrix on respective surfaces formed in the X and Y directions.

As shown in FIG. 1, each of the memory cells MC includes a diode DI and a variable resistance element R connected in series. The diode DI is disposed to prevent a sneak current during read/write. The variable resistance element R is electrically rewritable and stores data in a nonvolatile manner based on the resistance value. The diode DI has its anode connected to the word line WL and its cathode connected to one end of the variable resistance element R. The other end of the variable resistance element R is connected to the bit line BL.

As shown in FIG. 1, the word line selection circuit 20a has a plurality of select transistors Tra (Tra1, Tra2). One ends of the select transistors Tra are connected to one ends of the word lines WL, and the other ends connected to the word line drive circuit 20b. Signals Sa (Sa1, Sa2) are supplied to the gates of the select transistors Tra. That is, the word line selection circuit 20a controls the signals Sa to selectively connect the word lines WL to the word line drive circuit 20b.

As shown in FIG. 1, the word line drive circuit 20b applies a voltage to a word line WL that is required for erasing data in, writing data to, and reading data from a memory cell MC.

As shown in FIG. 1, the bit line selection circuit 30a has a plurality of select transistors Trb (Trb1, Trb2). One ends of the select transistors Trb are connected to one ends of the bit lines BL, and the other ends connected to the bit line drive circuit 30b. Signals Sb (Sb1, Sb2) are supplied to the gates of the select transistors Trb. That is, the bit line selection circuit 30a controls the signals Sb to selectively connect the bit lines BL to the bit line drive circuit 30b.

As shown in FIG. 1, the bit line drive circuit 30b applies a voltage to a bit line BL that is required for erasing data in, writing data to, and reading data from a memory cell MC. In addition, the bit line drive circuit 30b outputs the data read from a bit line BL to outside.

[Stacking Structure of Memory Cell Array 10 in Accordance with Embodiment]

Figure 2:
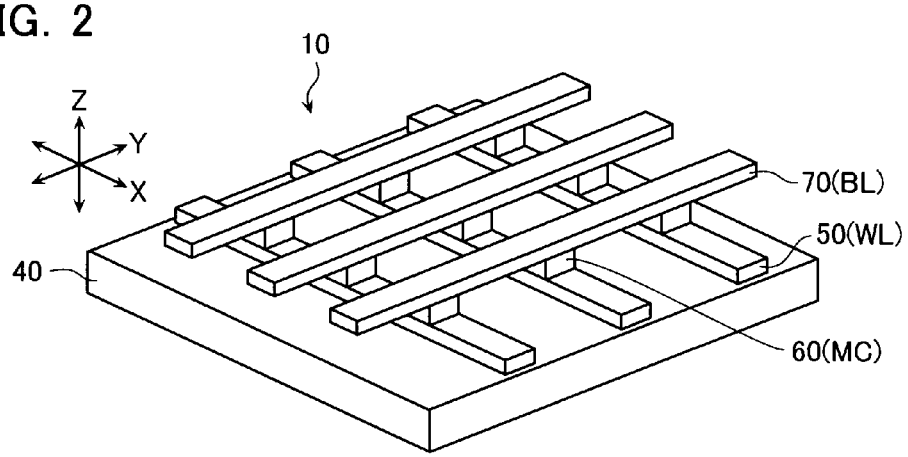
FIG. 2 is an enlarged perspective view showing an example of a memory cell array 10 in accordance with the embodiment.
Figure 3:
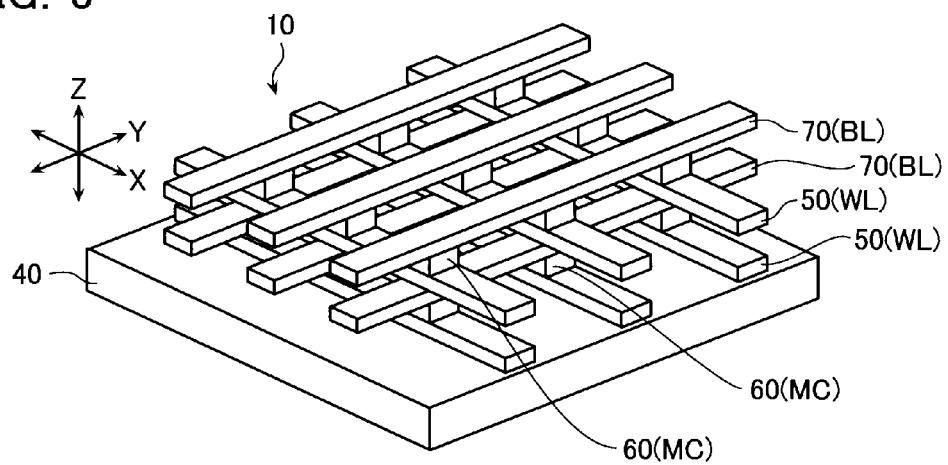
FIG. 3 is an enlarged perspective view showing an example of the memory cell array 10 in accordance with the embodiment.
Figure 4:
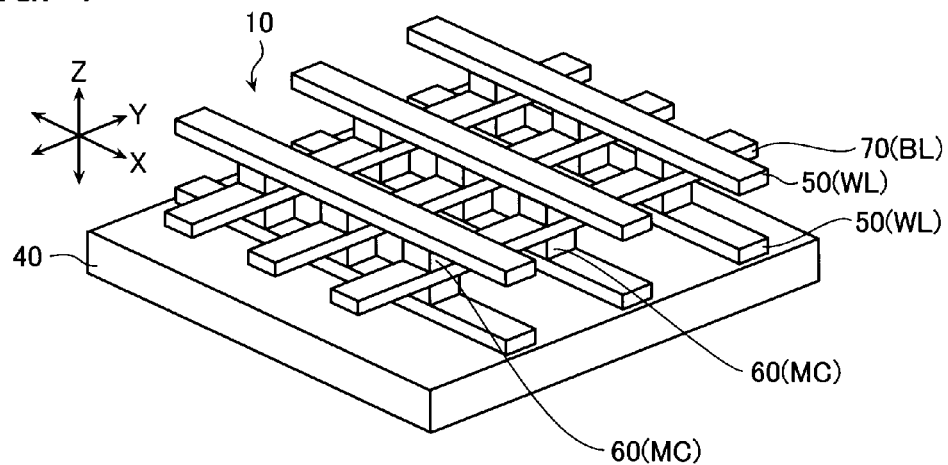
FIG. 4 is an enlarged perspective view showing an example of the memory cell array 10 in accordance with the embodiment.

Next, a stacking structure of the memory cell array in accordance with the embodiment is described with reference to FIGS. 2-4. FIGS. 2-4 are enlarged perspective views each showing an example of the memory cell array 10 in accordance with the embodiment.

For example, as shown in FIG. 2, the memory cell array 10 includes, in layers above a substrate 40, from lower layer to upper layer, a first conductive layer 50, a memory layer 60, and a second conductive layer 70. The first conductive layer 50 functions as the word lines WL. The memory layer 60 functions as the memory cells MC. The second conductive layer 70 functions as the bit lines BL.

As shown in FIG. 2, the first conductive layer 50 is formed in stripes extending in the X direction and having a certain pitch in the Y direction. The first conductive layer 50 includes metal. The first conductive layer 50 is preferably composed of a heat-resistant and low-resistance material, for example, tungsten (W), titanium (Ti), tantalum (Ta), and a nitride thereof, or a stacking structure thereof.

As shown in FIG. 2, the memory layer 60 is provided on the first conductive layer 50 and arranged in a matrix in the X and Y directions.

As shown in FIG. 2, the second conductive layer 70 is formed in stripes extending in the Y direction and having a certain pitch in the X direction. The second conductive layer 70 is formed in contact with an upper surface of the memory layer 60. The second conductive layer 70 is preferably composed of a heat-resistant and low-resistance material, for example, tungsten (W), titanium (Ti), tantalum (Ta), and a nitride thereof, or a stacking structure thereof.

Moreover, for example, as shown in FIG. 3, the memory cell array 10, in addition to having the configuration of FIG. 2, may be configured to have a first conductive layer 50, memory layer 60, and second conductive layer 70 further stacked in a layer above the configuration of FIG. 2, with an insulating layer interposed therebetween.

Moreover, for example, as shown in FIG. 4, the memory cell array 10 may be configured to include a memory layer formed on an upper surface of the second conductive layer 70 in FIG. 2, and a first conductive layer 50 formed on an upper surface of the memory layer 60. That is, as shown in FIG. 4, the memory cell array 10 may be configured to have the second conductive layer 70 shared by the memory layers 60 above and below.

Figure 5:
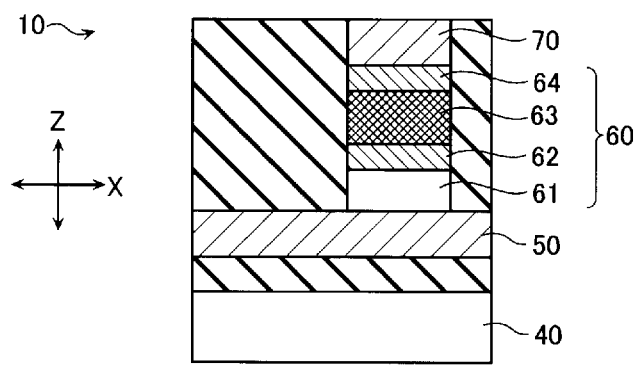
FIG. 5 is a cross-sectional view of FIG. 2.

Next, a stacking structure of the memory layer 60 is described in detail with reference to FIG. 5. FIG. 5 is a cross-sectional view of FIG. 2.

As shown in FIG. 5, the memory layer 60 includes, from lower layer to upper layer, a diode layer 61, a first electrode layer 62, a variable resistance layer 63, and a second electrode layer 64.

The diode layer 61 is formed on an upper surface of the first conductive layer 50. The diode layer 61 functions as the diode DI. The diode layer 61 is configured by, for example, a MIM (Metal-Insulator-Metal) structure, a PIN structure (P+poly-Silicon-Intrinsic-N+poly-Silicon), or the like.

The first electrode layer 62 is formed on an upper surface of the diode layer 61. The first electrode layer 62 includes any one of nitride, carbide and oxide. When the first electrode layer 62 includes nitride or carbide, at least one compound is selected therefor from a group of compounds g1. The group of compounds g1 consists of Ti—N, Ti—Si—N, Ta—N, Ta—Si—N, Si—N, Ti—C, Ta—C, Si—C, and W—N.

Alternatively, the first electrode layer 62 includes any one of: a mixture of nitride and oxide; a mixture of nitride and carbide; a mixture of oxide and carbide; and a mixture of nitride, oxide and carbide. When the first electrode layer 62 includes nitride or carbide, at least one compound is selected therefor from a group of compounds g1.

Moreover, the first electrode layer 62 may be a stacking film composed of: at least one element from the group of elements g2 consisting of hydrogen (H), boron (B), nitrogen (N), silicon (Si), and titanium (Ti); and at least one element from a group of elements g3 consisting of tungsten (W), tantalum (Ta), silicon (Si), iridium (Ir), ruthenium (Ru), gold (Au), platinum (Pt), palladium (Pd), molybdenum (Mo), nickel (Ni), chrome (Cr), and cobalt (Co).

The variable resistance layer 63 is formed on an upper surface of the first electrode layer 62. The variable resistance layer 63 functions as the variable resistance element R. The variable resistance layer 63 changes its electrical resistivity according to at least one of an applied voltage and a conducting current. The variable resistance layer 63 has a film thickness of not less than 5 nm, and not more than 70 nm.

The second electrode layer 64 is formed between an upper surface of the variable resistance layer 63 and a lower surface of the second conductive layer 70. Here, the second electrode layer 64 includes a similar material to that of the above-described first electrode layer 62.

Figure 6:
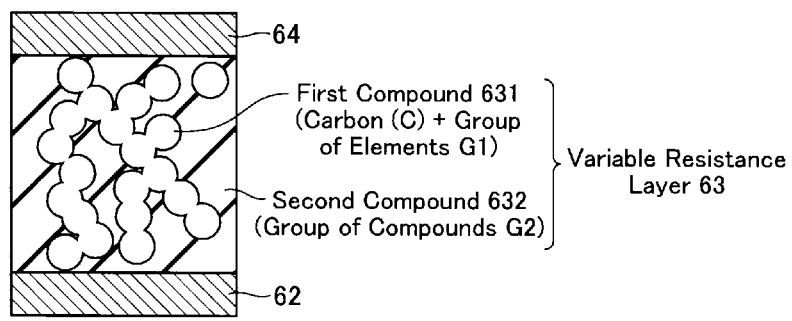
FIG. 6 is a cross-sectional view showing a variable resistance layer 63.

Next, a configuration of the variable resistance layer 63 is described in detail with reference to FIG. 6. FIG. 6 is a cross-sectional view showing the variable resistance layer 63.

As shown in FIG. 6, the variable resistance layer 63 includes a mixture of a first compound 631 and a second compound 632. The first compound 631 is a compound that includes carbon (C) as well as at least one element selected from a group of elements G1 consisting of hydrogen (H), boron (B), nitrogen (N), silicon (Si), and titanium (Ti). The second compound 632 is at least one compound selected from a group of compounds G2 consisting of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC).

Concentration of the first compound 631 in the variable resistance layer 63 is not less than 30 volume percent, and not more than 70 volume percent. When the element selected from the group of elements G1 is an element other than hydrogen (H) (that is, boron (B), nitrogen (N), silicon (Si), and titanium (Ti)), concentration of the relevant element or elements in the first compound 631 is preferably set to 0.01-20 atomic percent. In addition, when the element selected from the group of elements G1 is hydrogen (H), concentration of the hydrogen (H) in the first compound 631 is preferably set to 10-65 atomic percent, and more preferably set to 15-55 atomic percent.

The carbon (C) included in the first compound 631 is a mixture of a graphite component with a minute grain size and so-called amorphous carbon that has a disturbed crystal structure disordered over long distance. The one or more elements included in the group of elements G1 is dispersed within the above-described carbon (C), or formed between lattices of the crystal structure of the carbon (C) or between graphite layers.

As shown in FIG. 6, the first compound 631 forms a continuum from the first electrode layer 62 to the second electrode layer 64. This is because concentration of the first compound 631 in the variable resistance layer 63 is not less than 30 volume percent, and not more than 70 volume percent. Note that if concentration of the first compound 631 in the variable resistance layer 63 is less than 30 volume percent, a continuum is not formed, whereby the resistance of the variable resistance layer 63 increases and its characteristic as the variable resistance element R is impaired. On the other hand, if concentration of the first compound 631 in the variable resistance layer 63 is more than 70 volume percent, amount of the current increases, whereby power consumption becomes large.

As mentioned above, when the element selected from the group of elements G1 is an element other than hydrogen (H) (that is, boron (B), nitrogen (N), silicon (Si), and titanium (Ti)), concentration of the relevant element or elements in the first compound 631 is preferably set to 0.01-20 atomic percent. Existence of these elements in the first compound 631 with concentration in the above-described numerical range not only results in preventing the relevant elements from undergoing deposition from the first compound 631, but also allows a suitable magnitude of resistance changing amount (resistance ratio) to be obtained. If elements in the group of elements G1 undergo deposition from the first compound 631, the leak current increases and functioning of the variable resistance layer 63 is impaired. Existence of the elements of the group of elements G1 in the first compound 631 in the above-described proportion enables the variable resistance layer 63 to have its resistance changed greatly by an applied voltage or flowing current. That is, the resistance ratio between the high-resistance state and the low-resistance state can be set to a value sufficient to configure a multilevel storage memory. Moreover, stability of the variable resistance layer 63 can be increased, since deposition of the elements of the group of elements G1 is prevented.

If concentration of the elements of the group of elements G1 becomes less than the above-described numerical range, difficulties arise in resistance changing of the first compound 631. At the same time, if the concentration of the elements of the group of elements G1 becomes greater than the above-described numerical range, the leak current increases due to these elements undergoing deposition, and so on, leading to difficulties in resistance changing of the first compound 631.

As mentioned above, when the element selected from the group of elements G1 included in the first compound 631 is hydrogen (H), concentration of the hydrogen (H) in the first compound 631 is preferably 10-65 atomic percent. Note that although preferable concentration in the group of elements G1 differs for hydrogen (H) and elements other than hydrogen (H), hydrogen (H) and elements other than hydrogen (H) may be present simultaneously. In such a case, it is desirable that concentration of hydrogen (H) be 10-65 atomic percent and that concentration of elements other than hydrogen (H) be set to 0.01-20 atomic percent.

Now, the material having carbon (C) as main component assumes a variety of states from near-metal graphite to the ideal electrical insulator that is diamond. Graphite has a low electrical resistivity due to contribution of sp2 hybrid orbital elements or pi electron elements. On the other hand, diamond has a high electrical resistivity since contribution of sp3 hybrid orbital elements prevents carriers that contribute to electrical conduction (electrons or holes) from being generated. Note that various elements are known as carrier-forming dopant, but they are unable to produce an effect unless crystallinity in the parent diamond is increased to a high degree. Increasing crystallinity in the parent diamond is extremely difficult, particularly when forming a mixture.

In the present embodiment, if concentration of hydrogen (H) is less than 10 atomic percent, the sp2 orbital elements in the carbon (C) become too numerous, making it difficult to attain the high-resistance state and perform the resistance changing in the first compound 631. At the same time, if concentration of hydrogen (H) is more than 65 atomic percent with respect to the first compound 631, the sp3 orbital elements in the carbon (C) become too numerous, making it difficult to attain the low-resistance state and perform the resistance changing in the first compound 631. Moreover, if concentration of hydrogen (H) included in the group of elements G1 is 15-55 atomic percent with respect to the first compound 631, the first compound 631 can have its resistance changed even more easily.

The second compound 632 is configured by the group of compounds G2 that are typical electrical insulators, and has an electrical resistivity of $10^8$ Ωcm or more.

[Write/Erase/Read Operations in Embodiment]

Next, write/erase/read operations in the embodiment are described with reference once more to FIG. 1. Hereafter, it is assumed that the memory cell MC<1,1> of FIG. 1 is selected and the various operations executed thereon.

[Write Operation]

First, a write operation (setting operation) is described. In the write operation, the electrical potential of the selected word line WL1 is set to be relatively high compared to that of the selected bit line BL1. For example, a positive potential may be applied to the word line WL1 in order to set the bit line BL1 to the ground potential.

Through this step, a certain voltage is applied to the selected memory cell MC<1,1>, a potential gradient is created within the memory cell MC<1,1>, and a current pulse flows therethrough. Due to the current pulse, the variable resistance element R changes from the high-resistance state to the low-resistance state.

In addition, in this write operation, the voltage provided to the word line WL1 has a longer pulse width than that of the voltage provided in the erase operation. That is, in the write operation, voltage is applied to the word line WL1 for a longer period of time than in the erase operation.

In addition, it is desirable that the unselected word lines WL2 and the unselected bit lines BL2 are all biased to the same potential in the write operation. It is also desirable that all of the word lines WL1, WL2 and all of the bit lines BL1, BL2 are precharged during standby state before the write operation.

[Erase Operation]

Next, an erase operation (resetting operation) is described. In the erase operation, the potential of the selected word line WL1 is set to be relatively high compared to that of the selected bit line BL1. For example, a positive potential may be applied to the word line WL1 in order to set the bit line BL1 to the ground potential.

Through this step, a large current pulse flows into the selected memory cell MC<1,1>, and the erase operation is performed by means of the resulting Joule heat and residual heat. Alternatively, the erase operation is performed by means of the applied voltage due to the large current pulse, or current energy itself. In the erase operation, the variable resistance element R changes from the low-resistance state to the high-resistance state.

In addition, as described above, the voltage provided to the word line WL1 in this erase operation has a shorter pulse width than that of the voltage provided in the write operation. That is, in the erase operation, voltage is applied to the word line WL1 for a shorter period of time than in the write operation. As can be seen from the above, the erase operation and the write operation may be performed separately using different pulse widths for the erase operation and the write operation.

[Read Operation]

Next, a read operation is described. In the read operation, a current pulse (read current) is provided to the selected memory cell MC<1,1> from the selected bit line BL1. Then, the bit line drive circuit 30b reads the current from the bit line BL1 and measures the resistance of the memory cell MC<1, 1>, whereby the read operation is performed. However, the current pulse provided to the memory cell MC<1,1> must be set to a value minute enough not to cause resistance change in the material configuring the memory cell MC<1,1>.

[Method of Manufacturing]

Next, a method of manufacturing the variable resistance layer 63 of the nonvolatile semiconductor memory device in accordance with the embodiment is described.

Deposition in the variable resistance layer 63 is performed using CVD, sputtering or the like. In CVD, a hydrocarbon ($CH_x$) gas is used as the reaction gas. In this case, conditions of the deposition make it possible for hydrogen (H) to be included in the mainly carbon-constituted film.

In addition, during deposition of the variable resistance layer 63, a desired element may be added to the film by mixing into the reaction gas that includes the element to be added.

For example, the variable resistance layer 63 is deposited by mixing a desired material with silicon oxide, silicon nitride, carbon nitride, boron nitride, aluminum nitride, aluminum oxide, or silicon carbide into a gas such as a silane ($SiH_4$)-related gas, $SiH_4+N_2$ gas, or $B_2H_6+N_2$ gas with hydrocarbon ($CH_x$) gas added thereto.

For example, a film comprising carbon and hydrogen with a comparatively low density of about 1-1.6 g/cm³ is deposited, and then silicon oxide, silicon nitride, carbon nitride, boron nitride, aluminum nitride, aluminum oxide, or silicon carbide is deposited. The variable resistance layer 63 is thus formed by mixing due to diffusion. Now, if this density falls substantially below 1 g/cm³, the variable resistance layer cannot exist stably as a film. On the other hand, if this density greatly exceeds 1.6 g/cm³, it becomes difficult to mix insulators such as silicon oxide subsequent to film formation.

In addition, during deposition of the variable resistance layer 63, it is possible for silicon oxide to be included in the mainly carbon (C)-constituted film. This is possible through, for example, ALD (Atomic Layer Deposition) or CVD using precursors of small atomic radius.

In addition, during deposition of the variable resistance layer 63, carbon nitride can be formed by doping nitrogen into the carbon-and-hydrogen-constituted film. Heat diffusion, ion implantation and the like can be used as the method of doping. The concentration of nitrogen in the carbon nitride is preferably 10 atomic percent or more, and the insulation property of the carbon nitride increases with increasing concentration of nitrogen.

Note that when CVD is used in deposition of the variable resistance layer 63, a hydrocarbon gas such as acetylene ($C_2H_2$) or propylene ($C_3H_6$), a hydrocarbon gas obtained by vaporizing a precursor that is liquid at room temperature, or the like is used as the reaction gas. Then, hydrogen, nitrogen, oxygen, and so on are added to be partially reacted with the gas, whereby a mixture with an oxide or nitride can be formed. Moreover, introduction of an added element is also possible using a mixture of a carrier gas of helium (He), argon (Ar), nitrogen ($N_2$) or the like and a gas that includes the desired element. There are several methods of CVD, but plasma CVD (PECVD) is preferable since it allows deposition to be performed at a comparatively low temperature. In addition to using the generally commercially adopted plasma frequency band (13.56 MHz), a plasma frequency band of even lower frequency than this may also be used. Note that when a liquid is used as raw material, deposition by a similar method to the aforementioned CVD is possible subsequent to vaporization of the liquid. In this case, a wide range of variations may be adopted, such as mixing the components to be deposited in the liquid state, or mixing with other gases subsequent to vaporization, thereby raising the degree of freedom of the deposition.

Electrical resistivity of a thin film formed by CVD becomes of the order of $10^{-3}$ Ωcm or more, according to deposition conditions. CVD is particularly sensitive to deposition temperature, and a higher resistance film can be obtained when deposition temperature is low than when it is high. It is substantively difficult to use annealing or the like subsequent to formation of a thin film only of carbon to lower the electrical resistivity of the film. If such an annealing or the like is to be performed, heating to at least 1000° C. or more is required, and there is an extremely high risk that this causes damage to other parts of (device) elements. On the other hand, in the case of the present embodiment where the aforementioned elements are added to the carbon (C), it is easy to lower the electrical resistivity of the film during deposition, and, furthermore, it is also possible to achieve low resistance by annealing. Using CVD allows generation also of carbon nanotubes (CNT) and naturally also facilitates addition of various additives. A coating method can also be used for CNT.

When using sputtering method is used in deposition of the variable resistance layer 63, generally, an inert gas is used to sputter a sputtering target comprising graphite or the like. Since an inert gas such as argon (Ar) is generally used for the sputtering gas, hydrogen is not added to the film. In the case of adding hydrogen, the sputtering is implemented by, for example, mixing hydrogen gas or a gas including hydrogen, such as the above-mentioned hydrocarbon gas as a reaction gas with the inert gas. Note that the element or elements wished to be added can be mixed into the sputtering target, and these elements can be added to the film. There are several methods of sputtering, but magnetron sputtering excels in mass-producibility. If a sputtering target composed mainly of graphite is used, deposition using either of DC sputtering or RF sputtering is possible. There are cases where the added element or elements and quantity thereof result in a material of high electrical resistance, and in such cases RF sputtering can be used. Electrical resistivity of a thin film formed by sputtering becomes of the order of $10^{-1}$-$10^{-2}$ Ωcm or more, according to deposition conditions. Sputtering is sensitive to deposition temperature, and a film of comparatively high resistance can be obtained when deposition temperature is low. To obtain a mixture, so-called co-sputtering can be used. Co-sputtering is a process using as a sputtering target a mixture of the films of desired materials or a using plurality of sputtering targets. A material that suffers chemical reaction under a CVD method may form a mixture film under a sputtering method without chemical reaction thereof. If methods such as ion assistance or glow discharge are used in addition to ordinary sputtering, states such as graphite, amorphous carbon, diamond-like carbon (DLC), and CNT, or mixed states of these can be obtained.

EXAMPLES

Next, examples obtained to evaluate switching characteristics of the variable resistance element are described. A memory layer 60a having a stacking structure shown in FIG. 7 was manufactured as a sample used in the examples.

Figure 7:
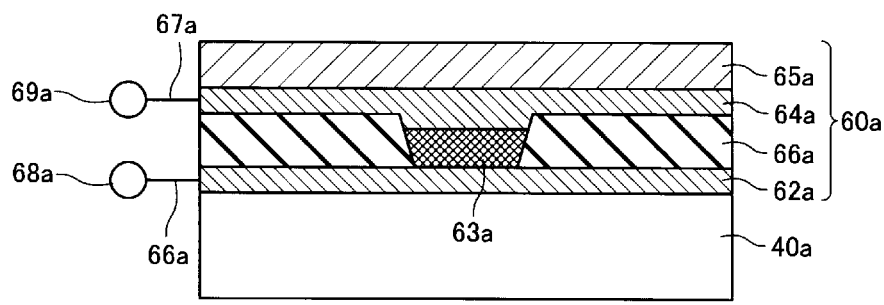
FIG. 7 is a cross-sectional view showing a memory layer 60a employed in examples.

The memory layer 60a includes, on a substrate 40a, a first electrode layer 62a, a variable resistance layer 63a, a second electrode layer 64a, a conductive layer 65a, and an insulating layer (SiO$_2$) 66a, as shown in FIG. 7.

The first electrode layer 62a is formed on the substrate 40a. The variable resistance layer 63a is formed in a column shape extending in the stacking direction from above (from an upper surface of) the first electrode layer 62a. The insulating layer 66a is formed on the first electrode layer 62a so as to surround a side surface of the variable resistance layer 63a. The second electrode layer 64a is formed on the variable resistance layer 63a and the insulating layer 66a. The conductive layer 65a is formed on the second electrode layer 64a.

In addition, the first electrode layer 62a and the second electrode layer 64a are connected by wires (W, Al) 67a and 67b to measuring pads 68a and 69a, respectively. The measuring pads 68a and 69a have a diameter φ of about 100 μm.

Evaluation of the switching characteristics was performed using a pair of probes. Tips of the pair of probes are sharpened to 10 nm or less. First, the pair of probes were brought into contact with the measuring pads 68a and 69a of each of the examples, and a voltage used in write/erase applied to the measuring pads 68a and 69a. Write was performed, for example, by applying a voltage pulse of 1-15 V and width 10 ns-100 ms. Erase was performed, for example, by applying a voltage pulse of 0.2-15 V and width 10 ns-100 ms. Note that an optimal value of pulse width for write and erase within the above-described range differs according to material and structure of the sample under measurement. Moreover, the pulse width for write and erase sometimes differs slightly according to number of times switching is performed, and optimized conditions are employed as measured characteristics. DC evaluation as in a semiconductor parameter analyser is also possible.

Evaluation of the switching characteristics was executed by performing read, subsequent to the above-described write and erase. In read, a voltage pulse of about 0.1-0.5 V and width 10-1000 ns was applied by the pair of probes, and the resistance value, current, voltage and so on of the memory layer 60a measured. Note that, during evaluation of the switching characteristics, a subsidiary circuit of protective resistance and the like can also be employed if required.

First Example

The variable resistance layer 63a in the memory layer 60a in accordance with a first example is constituted by a mixture of: a compound S1 comprising carbon (C) and hydrogen (H); and an insulator of silicon oxide.

The variable resistance layer 63a has a diameter φ of 0.25 μm and a height H of 50 nm.

Concentration of hydrogen in the compound S1 is 50 atomic percent. Concentration of the compound S1 in the mixture is 34 volume percent. Measurement of these concentrations is performed by cross-sectional observation or the like using, for example, a transmission electron microscope (TEM).

The first electrode layer 62a and the second electrode layer 64a are composed of TiN.

The switching characteristics in the first example were evaluated. As a result, the resistance value of the reset state (high-resistance state) was found to be of the order of $10^7$ Ω, and the resistance value of the set state (low-resistance state) was found to be of the order of $10^4$ Ω. This means that probability of incorrect switching is kept low, and power consumption is low. Moreover, a cycle life of 10,000 cycles or more can be realized. In addition, the resistance value of the set state (low-resistance state) is of the order of $10^4$ Ω, whereby cell current is kept in an appropriate range and power consumption suppressed.

Second Example

The variable resistance layer 63a in the memory layer 60a in accordance with a second example is constituted by a mixture of: the compound S1 comprising carbon (C) and hydrogen (H); and an insulator of silicon nitride.

The variable resistance layer 63a has a diameter φ of 0.15 μm and a height H of 20 nm.

Concentration of hydrogen in the compound S1 is 15 atomic percent. Concentration of the compound S1 in the mixture is 40 volume percent.

The first electrode layer 62a includes TiSi. The second electrode layer 64a includes TiN.

The switching characteristics in the second example were evaluated. As a result, the resistance value of the reset state was found to be of the order of $10^7 \Omega$, and the resistance value of the set state was found to be of the order of $10^4 \Omega$. This means that probability of incorrect switching is kept low, and power consumption is low. In addition, the resistance value of the set state (low-resistance state) is of the order of $10^4 \Omega$, whereby cell current is kept in an appropriate range and power consumption suppressed.

Third Example

The variable resistance layer 63a in the memory layer 60a in accordance with a third example is constituted by a mixture of: the compound S1 comprising carbon (C) and hydrogen (H); and the insulator of silicon nitride.

The variable resistance layer 63a has a diameter p of 0.25 μm and a height H of 10 nm.

Concentration of hydrogen in the compound S1 is any of 10 atomic percent, 15 atomic percent, 55 atomic percent, and 65 atomic percent. Concentration of the compound Sl in the mixture is any of 30 volume percent, 50 volume percent, and 70 volume percent.

The first electrode layer 62a includes TiN. The second electrode layer 64a includes W.

The switching characteristics in the third example were evaluated. As a result, the resistance value of the reset state was found to be of the order of $10^7 \Omega$, and the resistance value of the set state was found to be of the order of $10^5 \Omega$. This means that probability of incorrect switching is kept low, and power consumption is low. In addition, the resistance value of the set state (low-resistance state) is of the order of $10^5 \Omega$, whereby cell current is kept in an appropriate range and power consumption suppressed.

Note that the switching characteristics were evaluated for examples where concentration of hydrogen in the compound S1 is set to less than 10 atomic percent, and to 65 atomic percent or more, and for examples where concentration of the compound S1 and silicon nitride in the mixture is set to less than 30 volume percent, and to 70 volume percent or more. However, in these examples, it was not possible to obtain such good results as in the third example. In addition, switching was easier and operation performed at a lower voltage and lower current when concentration of hydrogen in the compound S1 was set to 15 atomic percent or 55 atomic percent than when concentration of hydrogen in the compound S1 was set to atomic percent or 65 atomic percent. Accordingly, hydrogen concentration in the compound S1 is more preferably in a range from 15 atomic percent to 55 atomic percent.

Fourth Example

The variable resistance layer 63a in the memory layer 60a in accordance with a fourth example is constituted by a mixture of: the compound S1 comprising carbon (C) and hydrogen (H); and the insulator of silicon nitride.

The variable resistance layer 63a has a diameter φ of 0.15 μm and a height H of 50 nm.

Concentration of hydrogen in the compound S1 is 15 atomic percent. Concentration of the compound 51 in the mixture is 55 volume percent.

The first electrode layer 62a includes any one of materials A1, and the second electrode layer 64a includes any one of materials A2, where (material A1, material A2) are (TiN, W), (TiN, WN), (TiSi, W), (TiSi, WN), (TiSi, TiN), (W, TiSi), (W, WN), (WN, W), (WN, TiSi), and (WN, TiN).

The switching characteristics in the fourth example were evaluated. As a result, the resistance value of the reset state was found to be of the order of $10^8 \Omega$, and the resistance value of the set state was found to be of the order of $10^5 \Omega$. This means that probability of incorrect switching is kept low, and power consumption is low. In addition, the resistance value of the set state (low-resistance state) is of the order of $10^5 \Omega$, whereby cell current is kept in an appropriate range and power consumption suppressed.

Fifth Example

The variable resistance layer 63a in the memory layer 60a in accordance with a fifth example is constituted by a mixture of: the compound S1 comprising carbon (C) and hydrogen (H); and carbon nitride, boron nitride, aluminum nitride, aluminum oxide, respectively.

The variable resistance layer 63a has a diameter φ of 0.25 μm and a height H of 10 nm.

Concentration of hydrogen in the compound S1 is 50 atomic percent. Concentration of the compound S1 in the mixture is 50 volume percent.

The first electrode layer 62a includes TiN. The second electrode layer 64a includes W.

The switching characteristics in the fifth example were evaluated. As a result, the resistance value of the reset state was found to be of the order of $10^7 \Omega$, and the resistance value of the set state was found to be of the order of $10^5 \Omega$. This means that probability of incorrect switching is kept low, and power consumption is low. In addition, the resistance value of the set state (low-resistance state) is of the order of $10^5 \Omega$, whereby cell current is kept in an appropriate range and power consumption suppressed.

Sixth Example

The variable resistance layer 63a in the memory layer 60a in accordance with a sixth example is constituted by a mixture of: the compound S1 comprising carbon (C) and hydrogen (H); and silicon carbide (including silicon carbide and free carbon), or silicon nitride carbide (nitride-bonded silicon carbide), respectively. Composition of the silicon carbide including free carbon is preferably Si:C=1:1-2. When C is 1 or less, the amount of Si increases causing the resistance to fall, and when C is 2 or more, control of structure of the free carbon is difficult, whereby control of the film overall is difficult. In addition, composition of the silicon nitride carbide (nitride-bonded silicon carbide) is preferably SiC:N=1:0.1-0.5. When N is 0.1 or less, it becomes identical to SiC, and when N is 0.5 or more, it becomes identical to silicon nitride. Silicon nitride carbide (nitride-bonded silicon carbide) can also be expressed as a mixture or compound of silicon carbide and silicon nitride. Hydrogen in the mixture overall is not limited to belonging only to the compound S1, but may also belong to the silicon carbide or silicon nitride carbide (nitride-bonded silicon carbide), for example.

The variable resistance layer 63a has a diameter φ of 0.25 μm and a height H of 10 nm.

Concentration of hydrogen in the compound S1 is 50 atomic percent. Concentration of the compound S1 in the mixture is 50 volume percent.

The first electrode layer 62a includes TiN. The second electrode layer 64a includes W.

The switching characteristics in the sixth example were evaluated. As a result, the resistance value of the reset state was found to be of the order of $10^7 \Omega$, and the resistance value of the set state was found to be of the order of $10^5 \Omega$. This means that probability of incorrect switching is kept low, and power consumption is low. In addition, the resistance value of the set state (low-resistance state) is of the order of $10^5 \Omega$, whereby cell current is kept in an appropriate range and power consumption suppressed.

[Advantages of Nonvolatile Semiconductor Memory Device in Accordance with Embodiment]

In the nonvolatile semiconductor memory device in accordance with the embodiment, the concentration of the first compound G1 in the variable resistance layer 63 is not less than 30 volume percent, and not more than 70 volume percent. This makes the nonvolatile semiconductor memory device capable of write or erase at a lower voltage than conventional such devices. In addition, a difference in resistance value of write/erase states of $10^3$ or more can be secured by the above-described configuration. That is, the nonvolatile semiconductor memory device reduces power consumption and suppresses incorrect operation.

Note that the nonvolatile semiconductor memory device in accordance with the embodiment has a cross-point structure shown in FIGS. 2-4. The nonvolatile semiconductor memory device is thus capable of a high degree of integration since each of the memory cells MC does not require an individual MOS transistor.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the nonvolatile semiconductor memory device in accordance with the embodiment is utilizable as a readable (writable, write-capable) recording medium in a personal computer. If the present embodiment is utilized as a recording medium, higher recording density and lower power consumption are realizable than with existing hard disk or flash memory.

For example, in the present embodiment, the memory layer 60 includes the diode layer 61. However, if the variable resistance layer 63 has a configuration in which electrical resistance is changed according to direction of application of voltage, the diode layer 61 may be omitted.

In addition, in the present embodiment, the memory layer 60 includes the second electrode layer 64 on the upper surface of the variable resistance layer 63. However, if the variable resistance layer 63 has a configuration in which its resistance is changed by Joule heat, a heater layer may be provided between the variable resistance layer 63 and the second electrode layer 64. The heater layer generates heat due to an applied voltage.

What is claimed is:

1. A nonvolatile semiconductor memory device comprising electrically rewritable memory cells, each of the memory cells comprising a variable resistance layer with electrical resistivity changeable by at least one of an applied voltage and a conducting current, the variable resistance layer including a mixture of a first compound and a second compound, the first compound including carbon (C) as well as at least one element selected from a group of elements G1, the group of element G1 consisting of hydrogen (H), boron (B), nitrogen (N), silicon (Si), and titanium (Ti); and the second compound including at least one compound selected from a group of compounds G2, the group of compounds G2 consisting of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC), concentration of the first compound in the variable resistance layer being not less than 30 volume percent, and not more than 70 volume percent the at least one element selected from the group of elements G1 being hydrogen (H), and concentration of the group of elements G1 in the first compound being 10-65 atomic percent.

2. The nonvolatile semiconductor memory device according to claim 1, wherein the at least one element selected from the group of elements G1 is any one or more of boron (B), nitrogen (N), silicon (Si), and titanium (Ti), and concentration of the group of elements G1 in the first compound is 10-20 atomic percent.

3. The nonvolatile semiconductor memory device according to claim 1, wherein concentration of the hydrogen (H) in the first compound is 15-55 atomic percent.

4. The nonvolatile semiconductor memory device according to claim 1, wherein electrical resistivity of the second compound is $10^8$ $\Omega$cm or more.

5. The nonvolatile semiconductor memory device according to claim 1, wherein the carbon (C) configures a mixture of amorphous carbon.

6. The nonvolatile semiconductor memory device according to claim 5, wherein one or more elements included in the group of elements G1 is positioned between lattices or between layers of a crystal structure of the carbon (C).

7. The nonvolatile semiconductor memory device according to claim 1, wherein each of the memory cells further comprises:

a first electrode layer in contact with a lower surface of the variable resistance layer; and a second electrode layer in contact with an upper layer of the variable resistance layer.

8. The nonvolatile semiconductor memory device according to claim 7, wherein the first electrode layer and the second electrode layer each includes at least one compound from a group of compounds g1 consisting of Ti—N, Ti—Si—N, Ta—N, Ta—Si—N, Si—N, Ti—C, Ta—C, Si—C, and W—N.

9. The nonvolatile semiconductor memory device according to claim 7, wherein the first electrode layer and the second electrode layer each includes at least one element from a group of elements g2, and at least one element from a group of elements g3, the group of elements g2 consisting of hydrogen (H), boron (B), nitrogen (N), silicon (Si), and titanium (Ti), the group of elements g3 consisting of tungsten (W), tantalum (Ta), silicon (Si), iridium (Ir), ruthenium (Ru), gold (Au), platinum (Pt), palladium (Pd), molybdenum (Mo), nickel (Ni), chrome (Cr), and cobalt (Co).

10. A nonvolatile semiconductor memory device comprising electrically rewritable memory cells, each of the memory cells comprising a variable resistance layer with electrical resistivity changeable by at least one of an applied voltage and a conducting current, the variable resistance layer including a mixture of a first compound and a second compound, the first compound including carbon (C) as well as at least one element selected from a group of elements G1, the group of elements G1 consisting of boron (B), nitrogen (N), silicon (Si), and titanium (Ti), the second compound including at least one compound selected from a group of compounds G2, the group of compounds G2 consisting of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC), concentration of the group of elements G1 in the first compound being 0.01-20 atomic percent, electrical resistivity of the second compound being $10^8$ Ωcm or more.

11. The nonvolatile semiconductor memory device according to claim 10, wherein the carbon (C) includes a mixture of amorphous carbon.

12. The nonvolatile semiconductor memory device according to claim 11, wherein one or more elements included in the group of elements G1 is positioned between lattices or between layers of a crystal structure of the carbon (C).

13. A nonvolatile semiconductor memory device comprising electrically rewritable memory cells, each of the memory cells comprising a variable resistance layer with electrical resistivity changeable by at least one of an applied voltage and a conducting current, the variable resistance layer including a mixture of a first compound and a second compound, a first compound that includes carbon (C) and hydrogen (H); and a second compound including at least one compound selected from a group of compounds G2, the group of compounds G2 consisting of silicon oxide ($SiO_2$), silicon oxynitride (SiON), silicon nitride ($Si_3N_4$), carbon nitride ($C_3N_4$), boron nitride (BN), aluminum nitride (AlN), aluminum oxide ($Al_2O_3$), and silicon carbide (SiC), concentration of the hydrogen (H) in the first compound being 10-65 atomic percent.

14. The nonvolatile semiconductor memory device according to claim 13, wherein concentration of the hydrogen (H) in the first compound is 15-55 atomic percent.

15. The nonvolatile semiconductor memory device according to claim 13, wherein electrical resistivity of the second compound is $10^8$ Ωcm or more.

16. The nonvolatile semiconductor memory device according to claim 13, wherein the carbon (C) includes a mixture of amorphous carbon.

17. The nonvolatile semiconductor memory device according to claim 16, wherein the hydrogen (H) is positioned between lattices or between layers of a crystal structure of the carbon (C).

* * * * *